(12) United States Patent
Kim

(10) Patent No.: US 7,682,925 B2
(45) Date of Patent: Mar. 23, 2010

(54) CAPACITOR AND MANUFACTURING METHOD THEREOF

(75) Inventor: Nam Joo Kim, Yongin-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 458 days.

(21) Appl. No.: 11/644,818

(22) Filed: Dec. 22, 2006

(65) Prior Publication Data

US 2007/0148899 A1 Jun. 28, 2007

(30) Foreign Application Priority Data

Dec. 28, 2005 (KR) ............... 10-2005-0132733

(51) Int. Cl.
*H01L 27/108* (2006.01)

(52) U.S. Cl. .............. 438/396; 257/301; 257/304; 257/305

(58) Field of Classification Search ............... 438/243, 438/244, 387, 388; 257/E27.092, E29.347, 257/E21.397, 303, 301, E21.651
See application file for complete search history.

(56) References Cited

U.S. PATENT DOCUMENTS

2003/0213989 A1* 11/2003 Delpech et al. ............. 257/301

* cited by examiner

*Primary Examiner*—Brook Kebede
*Assistant Examiner*—Mohammad Choudhry
(74) *Attorney, Agent, or Firm*—The Law Offices of Andrew D. Fortney; Andrew D. Fortney; Sharon E. Brown Turner

(57) ABSTRACT

The disclosure concerns a capacitor including a trench; an insulation layer; a first polysilicon layer; a first patterned dielectric layer; a second polysilicon layer patterned into a plurality of vertical bars in the trench; a second dielectric layer along surfaces of the first dielectric layer and the second patterned polysilicon layer; and a third polysilicon layer on the second dielectric layer.

18 Claims, 3 Drawing Sheets

CAPACITOR AND MANUFACTURING METHOD THEREOF

BACKGROUND OF THE INVENTION

1. Field of the Invention

The present invention relates to a capacitor and a method for manufacturing the same.

2. Description of the Related Art

Capacitors used in semiconductor devices have either polysilicon-insulator-polysilicon (PIP) or metal-insulator-metal (MIM) structures. Since PIP capacitors may have a plan or platform shape, they generally occupy a large area, making it difficult to reduce the chip size.

A PIP capacitor according to the prior art will be described with reference to FIG. 1, which is a sectional view.

In FIG. 1, a field oxide layer 11 is formed on a silicon substrate 10 and the lower electrode 12 of the capacitor is formed on the field oxide layer 11. The lower electrode 12 is formed by depositing and patterning a polysilicon layer. Then, a dielectric layer 13 and an upper electrode 14 of the capacitor are formed on the lower electrode 12. The dielectric layer 13 and the upper electrode 14 are formed by patterning and depositing an oxide or nitride layer (e.g., $SiO_2$ or $Si_3N_4$) and a polysilicon layer, respectively.

After an inter-layer dielectric layer is deposited on the overall structure and selectively etched, contacts 16 (which are connected to either the upper or lower electrodes 12 and 14 of the capacitor) and metal wiring 17 (connected to contact 16) are formed thereon.

As described above, because conventional PIP capacitors have a plan or platform shape, the area occupied by the capacitor on the chip is large, which is an obstacle to reduction of chip area.

SUMMARY OF THE INVENTION

An object of the present invention is to provide a capacitor that has higher capacitance within the same unit area and a method of manufacturing the same.

Additional advantages, objectives, and features of the invention will be set forth in the description which follows and will become apparent to those skilled in the art upon examination of the following or may be learned from practice of the invention. These objectives may be realized by the structure(s) particularly pointed out in the written description and claims as well as the appended drawings.

An object of the present invention is to provide a capacitor which comprises a trench having a depth, in an area on a silicon substrate; an insulation layer on a surface of the trench and the silicon substrate; a first polysilicon layer formed on the insulation layer; a first dielectric layer formed and patterned on the first polysilicon layer; a second polysilicon layer patterned into an element having a plurality of vertical bars (e.g. 2-20 bars, preferably 3-10 bars), the second polysilicon element positioned in the trench, the second polysilicon element connected through the first dielectric layer to the first polysilicon layer; a second dielectric layer formed along surfaces of the first dielectric layer and the second polysilicon element; and a third polysilicon layer formed on the second dielectric layer, wherein the first and second polysilicon layers comprise a lower electrode of the capacitor, the first and second dielectric layers comprise a dielectric layer of the capacitor, and the third polysilicon layer comprises an upper electrode of the capacitor.

Another object is to provide a method of manufacturing a capacitor which comprises: forming a trench by etching a silicon substrate; depositing in turn an insulation layer, a first polysilicon layer, and a first dielectric layer on the silicon substrate; patterning the first dielectric layer; depositing a second polysilicon layer on the first dielectric layer in order to connect the first and second polysilicon layers through the first dielectric layer; patterning the second polysilicon layer to form an element comprising a plurality of vertical bars in the trench; depositing a second dielectric layer along surfaces of the first dielectric layer and the second polysilicon element; and depositing and patterning a third polysilicon layer on the second dielectric layer.

It is to be understood that both the foregoing general description and the following detailed description of the present invention are exemplary and are not intended to be limiting.

BRIEF DESCRIPTION OF THE DRAWINGS

The accompanying drawings illustrate embodiment(s) of the invention and together with the description serve to explain the principle(s) of the invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a capacitor and a method of manufacturing the same according to the present invention will be described with reference to the accompanying drawings.

In the description of an embodiment of the present invention, when something is formed "on" each layer, the word "on" includes the concepts of "directly on" and "indirectly on" or "over." In general, high quality films are obtained by thermal oxidation and can also be readily deposited by chemical vapor deposition (CVD).

Figure 1:
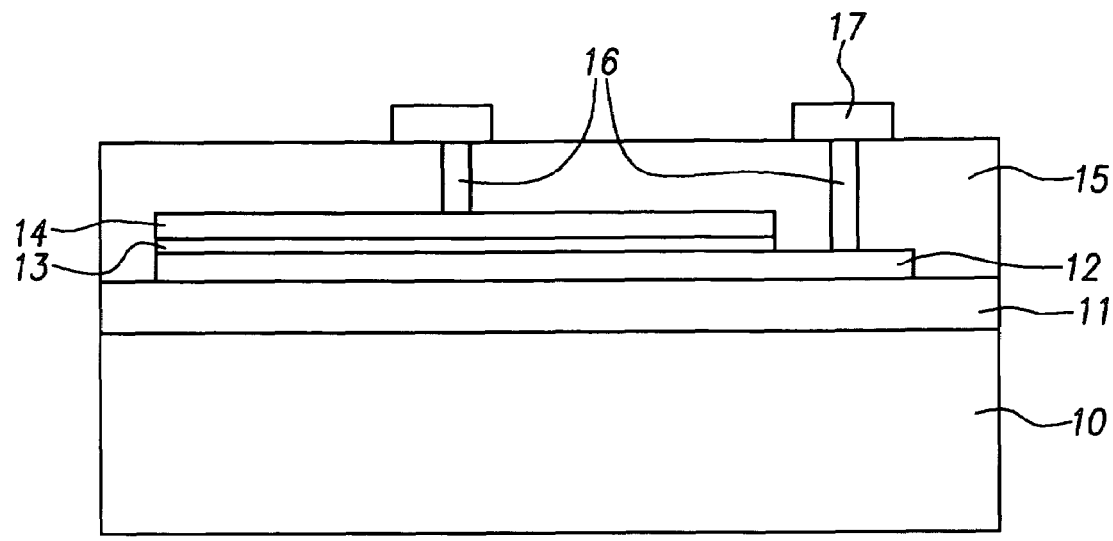
FIG. 1 shows the structure of a capacitor according to the prior art.
Figure 2:
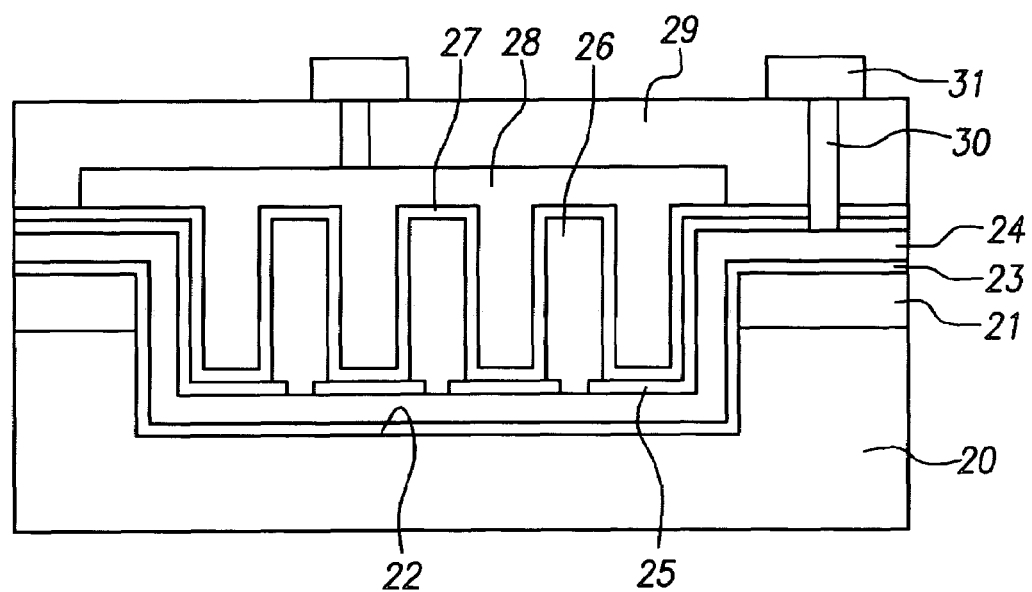
FIG. 2 is a sectional view showing a capacitor according to an embodiment of the present invention.

FIG. 2 is a sectional view showing a capacitor according to an embodiment of the present invention.

Referring to FIG. 2, a trench 22 is formed to a depth of from 2000 to 10,000 Å, preferably from 4000 to 8000 Å, in one region (or area) of a silicon substrate 20, and a field oxide layer 21 is formed in the other regions of the substrate 20. A lamination is formed by an insulation layer 23, the first polysilicon layer 24 and the first dielectric layer 25, patterned on the silicon substrate 20 as well as the inner surface of trench 22.

The second polysilicon element 26 may be in a shape of several vertical bars positioned in trench 22, which are connected to the first polysilicon layer 24 through the pattern in the first dielectric layer 25. The patterned second polysilicon layer or element 26 forms a lower electrode in combination with the first polysilicon layer 24.

Also, a second dielectric layer 27 is formed on the first dielectric layer 25 and the second polysilicon layer 26, along the surfaces of each, and a third polysilicon layer 28 is formed on the second dielectric layer 27. Thus the second dielectric layer 27 forms a dielectric layer of the capacitor along with the first dielectric layer 25, while the third polysilicon layer 28 becomes an upper electrode.

The whole structure is coated with an inter-layer insulation layer 29, and metal wires 31 are formed thereon. Metal wiring 31 is connected to the first polysilicon layer 24 and to the third polysilicon layer 28 through contacts 30 selectively formed in the inter-layer insulation layer 29. Such contacts may include conventional tungsten plugs, doped polysilicon, or copper, and may further include conventional adhesive (e.g., Ti or Ta) and/or barrier (e.g., TiN or TaN) liner layers.

Hereinafter, a method of manufacturing a capacitor according to the invention will be described. FIG. 3 through FIG. 6 are sectional views illustrating a method of manufacturing a capacitor according to the invention.

Figure 3:
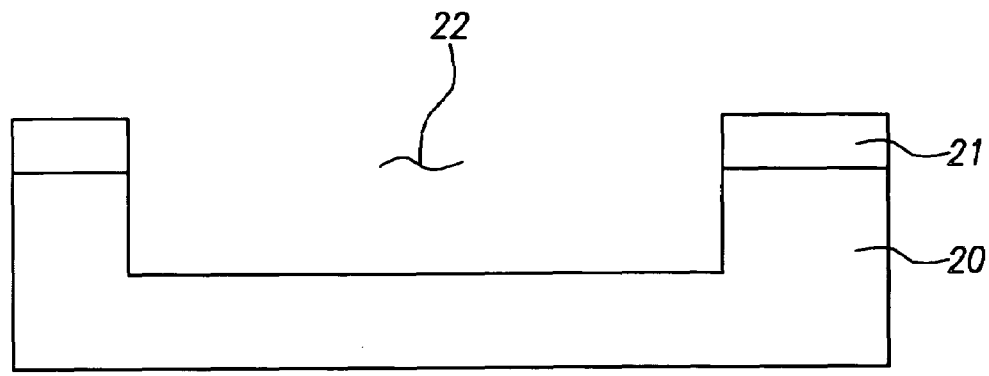
FIG. 3 through FIG. 6 are sectional views for illustrating a method of manufacturing a capacitor according to another embodiment of the present invention.
Figure 4:
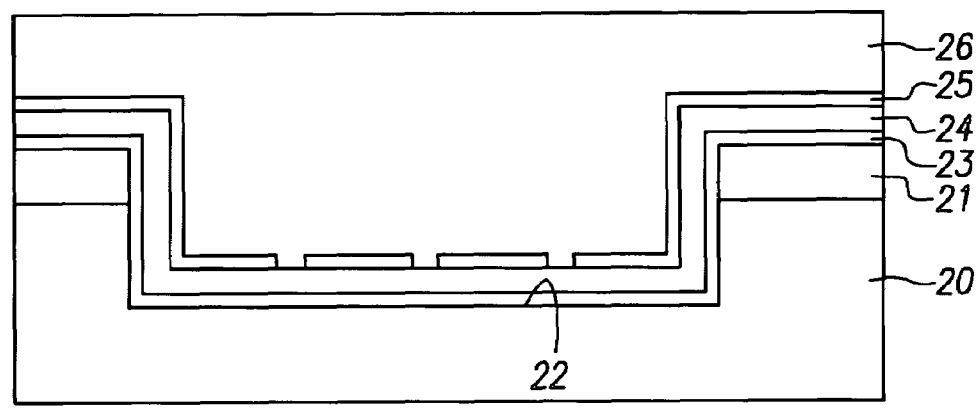

First, as shown in FIG. 3, after forming a field oxide layer 21 on the silicon substrate 20, a trench 22 for the capacitor is formed by partially etching the field oxide layer 21 and the silicon substrate 20 using a lithography process and an etching process. Lithography is used to transfer a pattern from a mask/reticle to the layer of resist deposited on the surface of the wafer. The kind of lithography depends on the wavelength of radiation used to expose the resist: photolithography (or optical lithography) uses UV radiation, X-ray lithography uses X-ray, e-beam lithography uses electron bean, ion beam lithography uses ion beam. Etching may be performed by any known process, including chemical reaction between chemically reactive etching species and the material to be etched, sputter etching through physical interactions (momentum transfer) between accelerated chemically inert ions (e.g. Ar+), plasma etching, ion milling, Reactive Ion Etching, or combinations thereof. Then, as shown in FIG. 4, an insulation layer 23, the first polysilicon layer 24, and the first dielectric layer 25 are in turn deposited. The insulation layer 23 and the first dielectric layer 25 are or comprise an oxide layer or nitride layer (e.g., $SiO_2$ or $Si_3N_4$). Then, after patterning the first dielectric layer 25, the second polysilicon layer 26 is deposited. The patterning of the first dielectric layer 25 is for connecting the first polysilicon layer 24 and the second polysilicon element 26 to each other. The first polysilicon layer 24 is connected to a contact in a later process.

Figure 5:
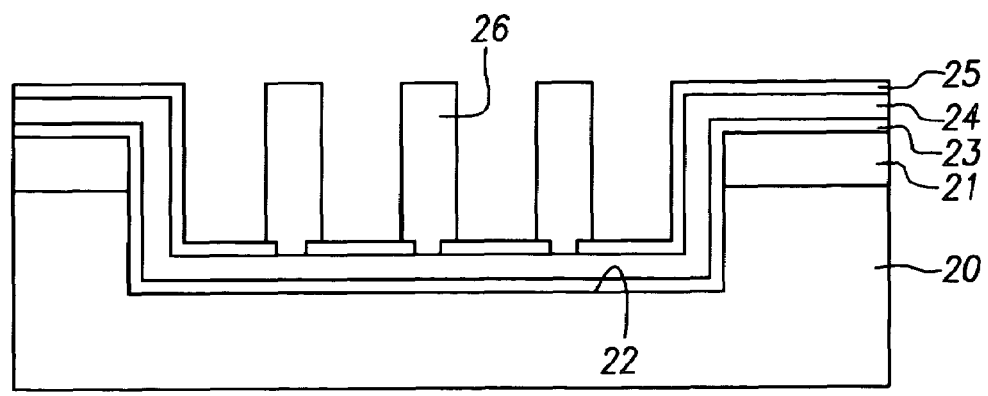

Then, as shown in FIG. 5, the second polysilicon element 26 is patterned. The second polysilicon element 26 once patterned becomes a lower electrode of the capacitor as connected to the first polysilicon layer 24. Because the patterned second polysilicon layer 26 has a shape comprising a plurality of vertical bars, the second polysilicon element 26 has a larger surface area than a plan-shaped capacitor of the same area. In this embodiment, though the second polysilicon element 26 has a vertical structure, all of it is positioned in trench 22, such that the whole height is not increased. Alternatively, the second polysilicon element 26 may extend above the trench (not shown).

Figure 6:
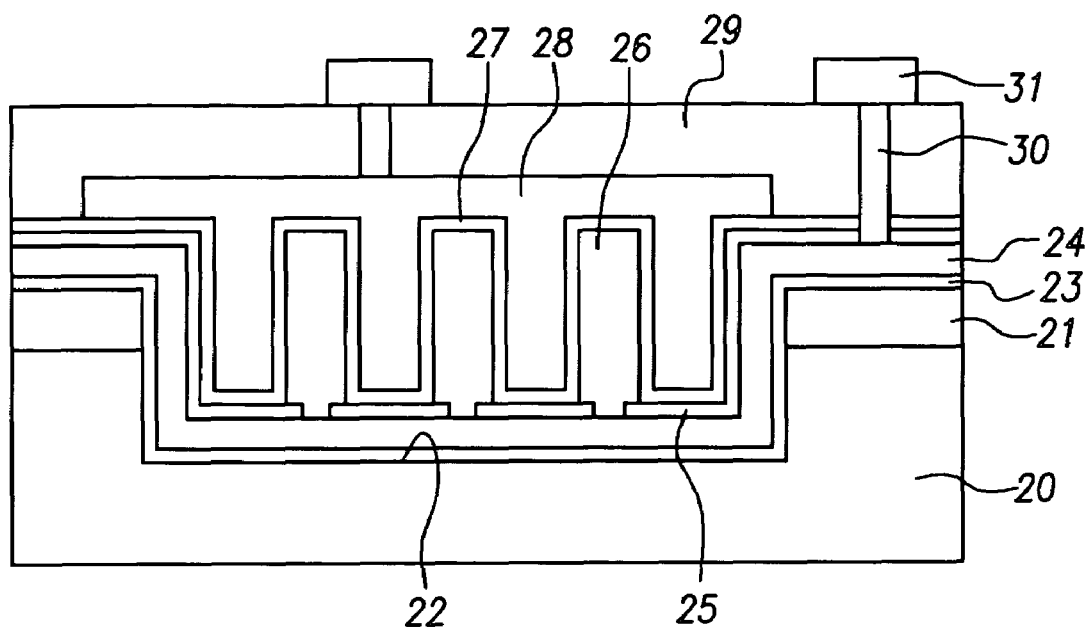

Then, as shown in FIG. 6, the second dielectric layer 27 is deposited along the surface of the whole structure. The second dielectric layer 27 is an oxide or nitride layer and is used with the first dielectric layer 25 as the dielectric layer of the capacitor. Continuously, an upper electrode of the capacitor is formed by depositing and patterning the third polysilicon layer 28. Because the patterned second polysilicon element 26 has a vertical structure, the third polysilicon layer 28 has a structure corresponding to that of the second polysilicon element 26, and so the surface area between the upper and low electrodes of the capacitor is increased. Therefore, the area occupied by a capacitor on a chip may be decreased or a higher capacitance may be obtained on a chip of the same area.

Hereinafter, in the same manner as that of the prior art, after an inter-layer insulation layer 29 is deposited on the whole structure and selectively etched, contacts 30 are formed for connecting to the first and second polysilicon layers 24 and 26 with each other, and metal wiring 31 is connected to the contact 30.

As described above, the present invention implements a capacitor having a complex structure of a plane and vertical elements. Because the second polysilicon layer forming the lower electrode of the capacitor has the shape comprising a plurality of vertical bars, the second polysilicon layer has a larger area then the chip region it covers. Corresponding to this, the surface area of the third polysilicon layer forming the upper electrode of the capacitor is increased. Since capacitance can be increased by increasing the surface area of the capacitor, the area that the capacitor occupies on the chip can be reduced. In a preferred embodiment, because this structure is formed in the trench, there the total height is not significantly increased by the vertical structure of the capacitor.

Further, according to the present invention, the lower electrode of the capacitor is a duplicate structure further comprising the first polysilicon layer formed in a plan structure. By using the plan structure of the first polysilicon layer, there is an effect of being easily connected with a contact.

Although a few embodiments of the present invention have been shown and described, it will be appreciated by those of skill in the art that changes might be made in this embodiment without departing from the principles and spirit of the invention, the scope of which is defined in the claims and their equivalents.

The invention claimed is:

1. A method of manufacturing a capacitor, comprising:
   forming a trench by etching part of a silicon substrate;
   depositing in turn an insulation layer, a first polysilicon layer, and a first dielectric layer on the silicon substrate;
   patterning the first dielectric layer to expose a portion of the first polysilicon layer and in the exposed portion of the first polysilicon layer;
   depositing a second polysilicon layer on the first dielectric layer and in the exposed portion of the first polysilicon layer;
   forming a plurality of separated vertical bars in the trench by patterning the second polysilicon layer;
   depositing a conformal second dielectric layer along surfaces of the first dielectric layer and the plurality of separated vertical bars of the second polysilicon layer; and
   depositing and patterning a third polysilicon layer on the second dielectric layer.

2. The method as claimed in claim 1, further comprising:
   forming contacts connected to the first polysilicon layer and the third polysilicon layer, respectively.

3. The method of claim 1, wherein patterning the second polysilicon layer forms at least two vertical bars.

4. The method of claim 1, wherein patterning the second polysilicon layer forms at least three vertical bars.

5. The method of claim 1, wherein the first and second dielectric layers comprise $SiO_2$ or $Si_3N_4$.

6. The method of claim 1, wherein the first and second dielectric layers comprise different materials.

7. The method of claim 1, wherein etching comprises chemical etching, sputter etching, plasma etching, ion milling, reactive ion etching, or a combination thereof.

8. The method of claim 1, wherein a height of the separated vertical bars extends above the trench.

9. The method of claim 1, further comprising forming a field oxide layer on the silicon substrate before forming the trench.

10. The method of claim 1, comprising etching the trench to a depth of from 4,000 to 8,000 Å.

11. The method of claim 2, further comprising forming an inter-layer insulation layer on the third polysilicon layer and portions of the second dielectric layer.

12. The method of claim 11, wherein the contacts are formed in the inter-layer insulation layer.

13. The method of claim 12, further comprising forming metal wires on the inter-layer insulation layer, wherein the metal wires are connected to the first polysilicon layer and the third polysilicon layer through the contacts.

14. The method of claim 2, wherein the contacts comprise tungsten, doped polysilicon, or copper.

15. The method of claim 2, wherein forming the contacts comprises forming a barrier liner layer.

16. The method of claim 15, wherein the barrier liner layer comprises TiN or TaN.

17. The method of claim 2, wherein the contacts are formed with an adhesive.

18. The method of claim 17, wherein the adhesive comprises Ti or Ta.

* * * * *